US010262908B2

(12) United States Patent
Mori (10) Patent No.: US 10,262,908 B2
(45) Date of Patent: Apr. 16, 2019

(54) METHOD FOR MANUFACTURING SEMICONDUCTOR DEVICE

(71) Applicant: Renesas Electronics Corporation, Koutou-ku, Tokyo (JP)

(72) Inventor: Kaoru Mori, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 58 days.

(21) Appl. No.: 15/430,413

(22) Filed: Feb. 10, 2017

(65) Prior Publication Data
US 2017/0278849 A1 Sep. 28, 2017

(30) Foreign Application Priority Data
Mar. 28, 2016 (JP) .................................. 2016-063384

(51) Int. Cl.
*H01L 21/66* (2006.01)
*H01L 29/66* (2006.01)
(Continued)

(52) U.S. Cl.
CPC ............ *H01L 22/20* (2013.01); *H01L 21/266* (2013.01); *H01L 21/26513* (2013.01);
(Continued)

(58) Field of Classification Search
None
See application file for complete search history.

(56) References Cited

U.S. PATENT DOCUMENTS 5,863,824 A * 1/1999 Gardner ................. H01L 22/20
257/339
6,133,132 A * 10/2000 Toprac .................... H01L 22/20
257/E21.433
(Continued)

FOREIGN PATENT DOCUMENTS

JP 2001-196580 A 7/2001
JP 2001-308317 A 11/2001
(Continued)

*Primary Examiner* — Erik T Peterson
(74) *Attorney, Agent, or Firm* — Shapiro, Gabor and Rosenberger, PLLC (57) ABSTRACT

A method for manufacturing a semiconductor device includes the steps of: determining a first design dimension of a gate electrode of a selection MISFET, a second design dimension of a sidewall insulating film, and initial setting conditions for ion implantation for a high-concentration semiconductor region; forming the gate electrode; measuring a first processed dimension of the gate electrode; implanting ions to form a low-concentration semiconductor region at each end of the gate electrode; forming the sidewall insulating film over a sidewall of the gate electrode; measuring a second processed dimension of the sidewall insulating film; and implanting ions to form a high-concentration semiconductor region. In the former implantation step, execution conditions to the initial setting conditions are reset according to a deviation of the first processed dimension from the first design dimension and a deviation of the second processed dimension from the second design dimension, and the step is executed.

17 Claims, 8 Drawing Sheets

(51) Int. Cl.
*H01L 49/02* (2006.01)
*H01L 21/266* (2006.01)
*H01L 27/11582* (2017.01)
*H01L 27/108* (2006.01)
*H01L 21/265* (2006.01)
*H01L 27/11* (2006.01)

(52) U.S. Cl.
CPC ........ *H01L 22/12* (2013.01); *H01L 27/10814* (2013.01); *H01L 27/10873* (2013.01); *H01L 27/10894* (2013.01); *H01L 27/11582* (2013.01); *H01L 28/00* (2013.01); *H01L 29/6656* (2013.01); *H01L 29/6659* (2013.01); *H01L 29/66492* (2013.01); *H01L 27/10897* (2013.01); *H01L 27/1116* (2013.01)

(56) References Cited

U.S. PATENT DOCUMENTS

| | | | |
|---|---|---|---|
| 6,136,616 A * | 10/2000 | Fulford | H01L 21/2652 257/E21.337 |
| 6,232,189 B1 * | 5/2001 | Yi | H01L 22/20 257/E21.525 |
| 6,303,451 B1 * | 10/2001 | Zhang | H01L 22/20 257/E21.525 |
| 6,387,735 B1 | 5/2002 | Ueda | |
| 6,586,755 B1 * | 7/2003 | Krivokapic | H01L 21/67253 250/492.21 |
| 6,622,059 B1 * | 9/2003 | Toprac | G03F 7/70625 257/E21.525 |
| 2001/0041377 A1 | 11/2001 | Ono | |
| 2002/0132377 A1 * | 9/2002 | Conchieri | H01L 22/20 438/5 |
| 2003/0162341 A1 * | 8/2003 | Raebiger | H01L 22/20 438/197 |
| 2005/0130432 A1 * | 6/2005 | Machala, III | H01L 22/20 438/694 |
| 2005/0176225 A1 * | 8/2005 | Lee | H01L 22/20 438/514 |
| 2005/0192700 A1 * | 9/2005 | Holfeld | H01L 22/20 700/121 |
| 2006/0079044 A1 | 4/2006 | Shibata et al. | |
| 2009/0081814 A1 * | 3/2009 | Lei | H01L 22/12 438/7 |

FOREIGN PATENT DOCUMENTS

| | | |
|---|---|---|
| JP | 2001-332723 A | 11/2001 |
| JP | 2006-108498 A | 4/2006 |
| JP | 2008-028217 A | 2/2008 |

* cited by examiner

METHOD FOR MANUFACTURING SEMICONDUCTOR DEVICE

CROSS-REFERENCE TO RELATED APPLICATION

The present application claims priority from Japanese Patent Application No. 2016-63384 filed on Mar. 28, 2016, the content of which is hereby incorporated by reference into this application.

TECHNICAL FIELD OF THE INVENTION

The present invention relates to a method for manufacturing a semiconductor device, and for example, relates to a method for manufacturing eDRAM in which DRAM and a logic circuit are mounted together.

BACKGROUND OF THE INVENTION

For example, DRAM in embedded dynamic random access memory (eDRAM) includes a plurality of word lines extending, for example, in a first direction on a main surface of a semiconductor substrate, a plurality of bit lines extending in a second direction intersecting with the first direction, and a plurality of DRAM cells each disposed at an intersection between the word line and the bit line and electrically connected to the word line and the bit line.

The DRAM cell is constituted by one selection metal insulator field effect transistor (MISFET) and one capacitive element connected in series to the selection MISFET. The selection MISFET is constituted by a gate electrode integrally formed with the word line, and semiconductor regions serving as a source and a drain, respectively. One of the source and the drain is connected to the bit line, and the other is electrically connected to the capacitive element.

The logic circuit is constituted by a p-channel MISFET (pMISFET) and an n-channel MISFET (nMISFET). The pMISFET has a gate electrode and p-type semiconductor regions serving as a source and a drain, respectively, and the nMISFET has a gate electrode and n-type semiconductor regions serving as a source and a drain, respectively.

In general, in a MISFET constituting a logic circuit (hereinafter referred to as a logic MISFET), a feed-forward technique has been studied in manufacturing processes in order to improve electrical characteristics of the MISFET.

Japanese Patent Application Laid-Open Publication No. 2006-108498 discloses that dimensions of a formed gate electrode 102 are measured in order to suppress variations in element characteristics due to variations in dimensions of the gate electrode, and ion implantation conditions for a drain extension region 104 are set according to the measured dimensions.

Japanese Patent Application Laid-Open Publication No. 2001-196580 discloses that a length of a formed gate electrode is measured in order to preferably control transistor characteristics regarding a short-channel effect, and a dosage of ion implantation is variably set in order to form a source region and a drain region according to the measured value.

Japanese Patent Application Laid-Open Publication No. 2001-308317 discloses that a length of a formed gate electrode is measured in order to make transistor characteristics uniform, and a dosage for an SD extension region or a pocket region is adjusted according to the measured value.

Japanese Patent Application Laid-Open Publication No. 2008-28217 discloses that a resistance value of an impurity region 5p having the same level of impurity concentration as that of a first source/drain region 5 is measured, and an impurity concentration for forming a second source/drain region 7 is changed according to the measured value.

Japanese Patent Application Laid-Open Publication No. 2001-332723 discloses that electrical characteristics of a formed semiconductor element are tested in order to form a semiconductor element having characteristics close to design values, conditions for a coating covering the semiconductor element are determined according to the test result, and the coating is formed so as to meet the conditions.

SUMMARY OF THE INVENTION

The inventor of the present application has studied improvement of electrical characteristics of a selection MISFET constituting a DRAM cell of eDRAM, and has found the following problem.

Figure 12:
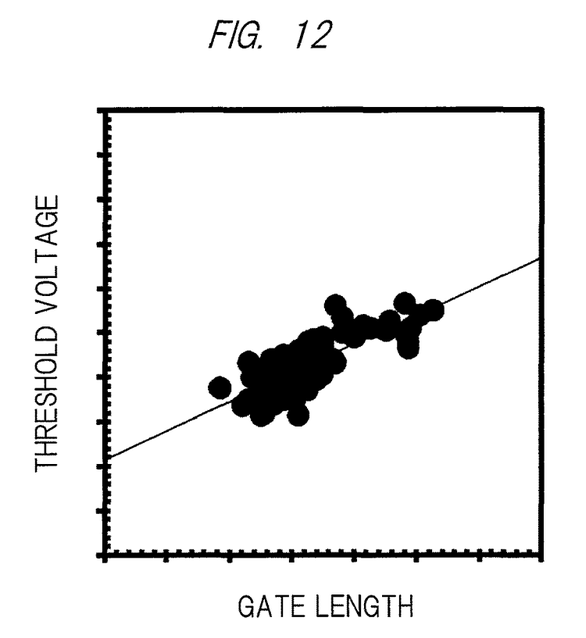
FIG. 12 is a diagram illustrating variations in threshold voltage of a selection MISFET of a DRAM cell.
Figure 13:
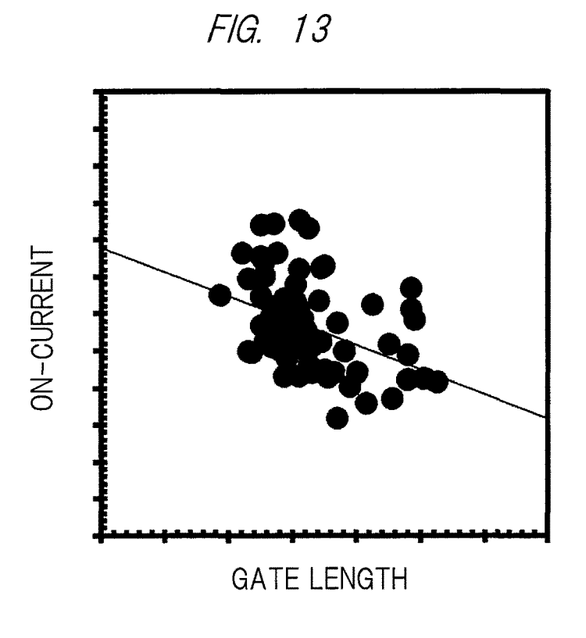
FIG. 13 is a diagram illustrating variations in on-current of the selection MISFET of the DRAM cell.

FIG. 12 is a diagram illustrating variations in threshold voltage of the selection MISFET of the DRAM cell, and FIG. 13 is a diagram illustrating variations in on-current of the selection MISFET of the DRAM cell. In FIGS. 12 and 13, data of the selection MISFETs formed in a plurality of semiconductor wafers are plotted. That is, FIGS. 12 and 13 illustrate variations in threshold voltage and on-current, respectively, among semiconductor wafers or among lots.

As illustrated in FIG. 12, there is excellent correlation between the gate length and the threshold voltage, and the variations are small. However, as illustrated in FIG. 13, there is poor correlation between the gate length and the on-current, and variations are great among the semiconductor wafers or among the lots. The inventor of the present application thinks that the cause for the variations in on-current is as follows.

In eDRAM which has been studied by the inventor of the present application, both the selection MISFET and the logic MISFET have an LDD structure. That is, each of a source region and a drain region is constituted by a low-concentration semiconductor region and a high-concentration semiconductor region. However, the impurity concentration in the low-concentration semiconductor region of the selection MISFET is lower than the impurity concentration in the low-concentration semiconductor region of the logic MISFET, and for example, a dosage of the impurity in the low-concentration semiconductor region of the selection MISFET is about three orders of magnitude lower than a dosage of the impurity in the low-concentration semiconductor region of the logic MISFET, in order to reduce leakage current in the source region and the drain region of the selection MISFET.

In addition, because of the manufacturing method of eDRAM, a length of the low-concentration semiconductor region is determined depending on a width of a sidewall insulating film formed on a sidewall of the gate electrode of the selection MISFET. That is, it is estimated that variations in width of the sidewall insulating film lead to variations in length of the low-concentration semiconductor region, which results in variations in on-current. Variations in on-current of the selection MISFET constituting the DRAM cell affect the writing or reading characteristic of the DRAM cells.

Therefore, a technique is required which improves electrical characteristics of a semiconductor device including DRAM cells.

Other objects and novel characteristics of the present invention will be apparent from the description of the present specification and the accompanying drawings.

A method for manufacturing a semiconductor device according to an embodiment includes: a step of determining in advance a first design dimension of a gate electrode of a selection MISFET, a second design dimension of a sidewall insulating film, and initial setting conditions for ion implantation for a high-concentration semiconductor region; a step of forming the gate electrode; a step of measuring a first processed dimension of the gate electrode; a first ion implantation step for forming a low-concentration semiconductor region at each end of the gate electrode; a step of forming a sidewall insulating film on a sidewall of the gate electrode; a step of measuring a second processed dimension of the sidewall insulating film; and a second ion implantation step for forming a high-concentration semiconductor region. In the second ion implantation step, execution conditions for the second ion implantation step with respect to the initial setting conditions are reset according to a deviation of the first processed dimension from the first design dimension and a deviation of the second processed dimension from the second design dimension, and the second ion implantation step is executed.

According to the embodiment, it is possible to improve electrical characteristics of the semiconductor device including DRAM cells.

DESCRIPTIONS OF THE PREFERRED EMBODIMENT

Hereinafter, an embodiment of the present invention will be described in detail with reference to the accompanying drawings. Note that components having the same function are denoted by the same reference characters throughout the drawings for describing the embodiment, and the repetitive description thereof is omitted. In addition, the description of the same or similar portions is not repeated in principle unless particularly required in the following embodiment.

In addition, in some drawings used in the embodiment, hatching may be omitted even in a cross-sectional view so as to make the drawings easy to see. Also, hatching may be used even in a plan view so as to make the drawings easy to see.

(Embodiment)

A semiconductor device according to the present embodiment includes eDRAM.

Figure 1:
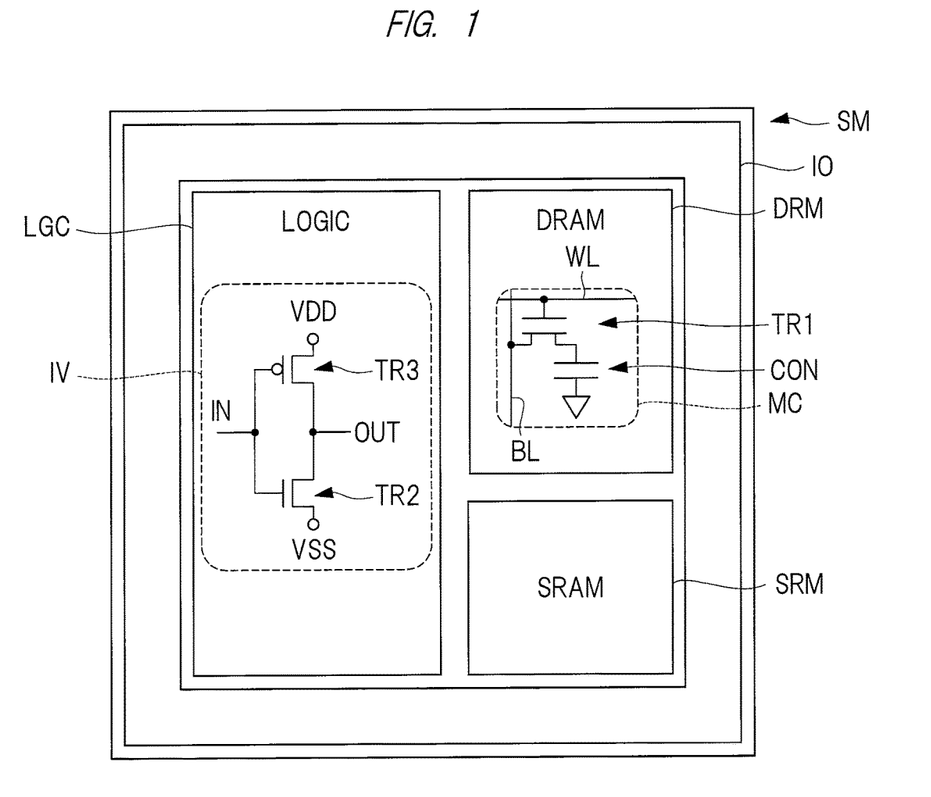
FIG. 1 is a plan view illustrating a configuration of a semiconductor device according to an embodiment.

FIG. 1 is a plan view illustrating a configuration of a semiconductor device SM according to the present embodiment. The semiconductor device SM includes a DRAM region DRM where DRAM is disposed, a static random access memory (SRAM) region SRM where SRAM is disposed, a logic circuit region LGC where a logic circuit is disposed, and an input/output (I/O) region IO where an I/O circuit is disposed. In the DRAM region DRM, there is a DRAM cell array where DRAM cells are arranged in matrix. The DRAM cell is constituted by one n-channel selection MISFET (TR1) and one capacitive element CON connected in series to the n-channel selection MISFET (TR1). Hereinafter, the n-channel selection MISFET will be described; however, a p-channel selection MISFET may be used as the selection MISFET. In the logic circuit region LGC, a logic circuit is disposed, and an example of the logic circuit is an inverter circuit IV where an n-channel MISFET (TR2) and a p-type MISFET (TR3) are connected in series.

Figure 2:
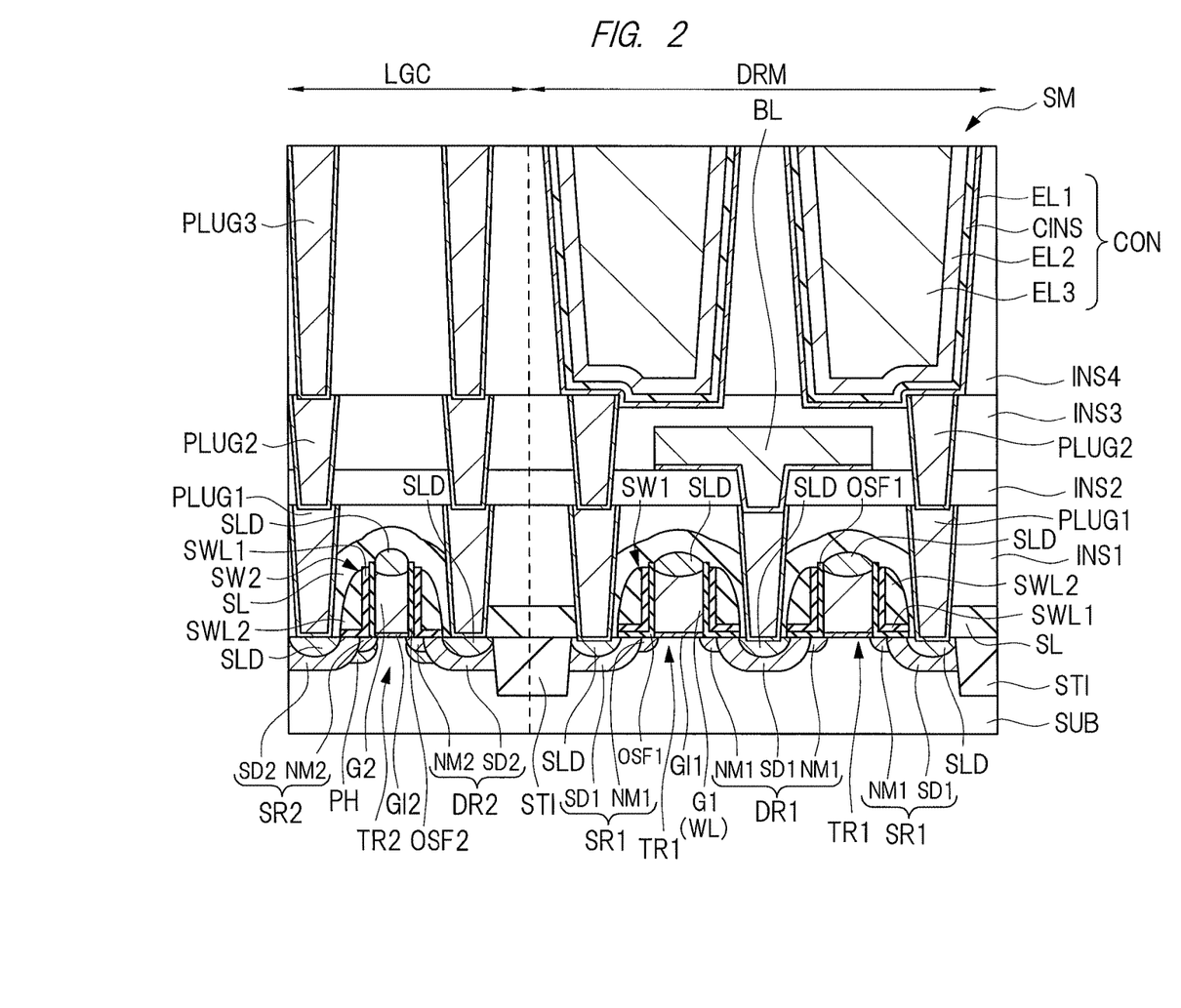
FIG. 2 is a cross-sectional view illustrating main parts of the semiconductor device according to the present embodiment.

FIG. 2 is a cross-sectional view illustrating main parts of the semiconductor device SM according to the present embodiment. In the DRAM region DRM, two DRAM cells are illustrated. In the logic circuit region LGC, the n-channel MISFET (TR2) is illustrated. Hereinafter, the n-channel MISFET (TR2) in the logic circuit region LGC is referred to as "logic MISFET (TR2)."

For example, the semiconductor device SM is formed of a semiconductor substrate SUB made of p-type silicon. A silicon on insulator (SOI) substrate may be used instead of the semiconductor substrate SUB. In the SOI substrate, a support substrate, an insulating layer, and a p-type silicon substrate are layered in this order. It is needless to say that n-type silicon may be used instead of the p-type silicon in the semiconductor substrate SUB or the SOI substrate.

The selection MISFET (TR1) is formed in a front surface of the p-type semiconductor substrate SUB, and includes a gate electrode G1, a source region SR1, and a drain region DR1. A source and a drain are swapped depending on operation of the DRAM cell; however, for the sake of description, a side connected to the capacitive element CON is referred to as the source region SR1, and a side connected to a bit line BL is referred to as the drain region DR1.

A p-type well region (not illustrated) may be provided in the front surface of the p-type semiconductor substrate SUB, and the selection MISFET may be formed in a p-type well. In this case, the p-type well region is considered to be included in the semiconductor substrate SUB.

The gate electrode G1 of the selection MISFET (TR1) is formed over a main surface of the semiconductor substrate SUB via a gate insulating film GI1. The gate electrode G1 constitutes a part of a word line WL extending in a direction orthogonal to the sheet surface of FIG. 2. For example, the gate electrode G1 is formed of a polycrystalline silicon film, and a silicide layer SLD is formed on an upper surface of the polycrystalline silicon film.

Each of the source region SR1 and the drain region DR1 of the selection MISFET (TR1) is constituted by an n-type low-concentration semiconductor region NM1 and an n-type high-concentration semiconductor region SD1. An impurity concentration in the high-concentration semiconductor region SD1 is higher than an impurity concentration in the low-concentration semiconductor region NM1. In addition, a p-n junction formed by the high-concentration semiconductor region SD1 and the p-type semiconductor substrate SUB is deeper than a p-n junction formed by the low-concentration semiconductor region NM1 and the p-type semiconductor substrate SUB. In addition, the source region SR1 of the selection MISFET (TR1) is in contact with an element separation film STI formed in the front surface of the semiconductor substrate SUB. The selection MISFET (TR1) is formed in a region (referred to as an active region) surrounded by the element separation film STI on the front surface of the semiconductor substrate SUB. Two selection MISFETs (TR1s) share the drain region DR1 and are connected to the bit line BL. The two selection MISFETs are arranged symmetrically with respect to the drain region DR1. The two selection MISFETs (TR1s) are disposed in one active region.

On each sidewall of the gate electrode G1 of the selection MISFET (TR1), an offset spacer film OSF1 is formed to be in contact with each sidewall of the gate electrode G1. As will be described later, the offset spacer film OSF1 is used for an ion implantation step for forming the low-concentration semiconductor region NM1. The offset spacer film OSF1 is a film for reducing an overlapping amount between the gate electrode G1 and the low-concentration semiconductor region NM1. Therefore, the offset spacer film OSF1 is formed on each sidewall of the gate electrode G1 on the source region SR1 side and the drain region DR1 side of the selection MISFET (TR1). In the DRAM region DRM, the offset spacer film OSF1 is present not only on the sidewalls of the gate electrode G1, but also between a sidewall insulating film SW1 and the semiconductor substrate SUB.

Over each sidewall of the gate electrode G1 of the selection MISFET (TR1), the sidewall insulating film SW1 is further formed. The sidewall insulating film SW1 is configured by layering an insulating film SWL1 and an insulating film SWL2 in this order. The insulating film SWL1 is formed along the sidewall of the gate electrode G1 and the main surface of the semiconductor substrate SUB. The offset spacer film OSF1 is interposed between the insulating film SWL1 and the sidewall of the gate electrode G1, and between the insulating film SWL1 and the main surface of the semiconductor substrate SUB. The insulating film SWL2 is formed to be thicker than the insulating film SWL1. The insulating film SWL1 and the insulating film SWL2 constitute the sidewall insulating film SW1 having a predetermined width in the direction vertical to the sidewall of the gate electrode G1. As will be described later, ion implantation for forming the high-concentration semiconductor region SD1 is performed by using the sidewall insulating film SW1 over the sidewall of the gate electrode G1 as a mask. That is, the high-concentration semiconductor region SD1 is formed against the sidewall insulating film SW1 in a self-aligned manner.

In the selection MISFET (TR1), the silicide layer SLD is formed on the upper surface of the gate electrode G1 and an upper surface of the high-concentration semiconductor region SD1.

Furthermore, the selection MISFET (TR1) is covered with a stress liner film SL. The stress liner film SL is formed of an insulating film such as a silicon nitride film, has stress enough to apply tensile stress to a channel formation region of the selection MISFET (TR1), and improves current driving capability of the selection MISFET (TR1).

An interlayer insulating film INS1 is formed over the semiconductor substrate SUB so as to cover the stress liner film SL. A plurality of first openings are formed in the interlayer insulating film INS1 and the stress liner film SL so as to penetrate the films INS1 and SL. Each of the first openings is filled with a plug electrode PLUG1 formed of a metal film. Incidentally, each of the source region SR1 and the drain region DR1 of the selection MISFET is connected to the plug electrode PLUG1 via the silicide layer SLD.

An interlayer insulating film INS2 is formed on the interlayer insulating film INS1. The interlayer insulating film INS2 covers the plurality of plug electrodes PLUG1 exposed to a front surface of the interlayer insulating film INS1. A second opening provided in the interlayer insulating film INS 2 is positioned on the plug electrode PLUG1 connected to the drain region DR1 of the selection MISFET. The bit line BL made of a metal film and provided on the interlayer insulating film INS2 and in the second opening is electrically connected to the drain region DR1 of the selection MISFET (TR1) via the plug electrode PLUG1. The bit line BL extends in a direction intersecting with the word line WL constituted by the gate electrode G1.

An interlayer insulating film INS3 is formed so as to cover the bit line BL. The interlayer insulating film INS3 and the interlayer insulating film INS2 are provided with a plurality of third openings penetrating the interlayer insulating films INS3 and INS2. A plug electrode PLUG 2 is formed in each of the third opening. The plug electrode PLUG2 is stacked on the plug electrode PLUG1 so as to electrically connect to the plug electrode PLUG1 connected to the source region SR1 of the selection MISFET (TR1).

An interlayer insulating film INS4 is formed on the interlayer insulating film INS3. The interlayer insulating film INS4 covers the plurality of plug electrodes PLUG2 exposed to a front surface of the interlayer insulating film INS3. The capacitive element CON of the DRAM cell includes a lower electrode EL1, a capacitive film CINS, an upper electrode EL2, and an upper electrode EL3, and is formed in a fourth opening provided in the interlayer insulating film INS4. A head of the plug electrode PLUG2 is exposed to the fourth opening. The lower electrode EL1 is formed on an inner wall of the fourth opening, the front surface of the interlayer insulating film INS3 inside the fourth opening, and the plug electrode PLUG2. The lower electrode EL1 is electrically connected to the plug electrodes PLUG1 and PLUG2 electrically connected to the source region SR1 of the selection MISFET (TR1). The capacitive film CINS and the upper electrode EL2 are formed over the lower electrode EL1. The upper electrode EL3 is formed on the upper electrode EL2. The lower electrode EL1, the capacitive film CINS, and the upper electrodes EL2 and EL3 are formed in the fourth opening so as to fill the fourth opening. For example, the lower electrode EL1 is a titanium nitride film. For example, the capacitive film CINS is a zirconium oxide film or a tantalum oxide film. For example, the upper electrode EL2 is a titanium nitride film, and the upper electrode EL3 is a tungsten film. The fourth opening in which the capacitive element CON is formed is greater in diameter in plan view than the third opening.

Next, a description will be given of the logic MISFET (TR2) illustrated in the logic circuit region LGC in FIG. 2.

A gate electrode G2 of the logic MISFET (TR2) is formed over the front surface of the semiconductor substrate SUB via a gate insulating film GI2. For example, the gate electrode G2 is formed of a polycrystalline silicon film, and the silicide layer SLD is formed on an upper surface of the polycrystalline silicon film.

Each of a source region SR2 and a drain region DR2 of the logic MISFET (TR2) is constituted by an n-type low-concentration semiconductor region NM2 and an n-type high-concentration semiconductor region SD2. An impurity concentration in the high-concentration semiconductor region SD2 is higher than an impurity concentration in the low-concentration semiconductor region NM2. In addition, in order to suppress elongation of a depletion layer from the drain region DR2 and the source region SR2, a p-type semiconductor region PH called a halo region is formed under the low-concentration semiconductor region NM2. Note that a p-type semiconductor region called a halo region is not formed in the selection MISFET (TR1). In addition, the source region SR2 and the drain region DR2 of the logic MISFET (TR2) are in contact with the element separation film STI formed in the front surface of the semiconductor substrate SUB. That is, the logic MISFET (TR2) is formed in an active region surrounded by the element separation film STI on the front surface of the semiconductor substrate SUB.

On each sidewall of the gate electrode G2 of the logic MISFET (TR2), an offset spacer film OSF2 is formed to be in contact with each sidewall of the gate electrode G2. As will be described later, the offset spacer film OSF2 is used for an ion implantation step for forming the low-concentration semiconductor region NM2. The offset spacer film OSF2 is a film for reducing an overlapping amount between the gate electrode G2 and the low-concentration semiconductor region NM2. Therefore, the offset spacer film OSF2 is formed on each sidewall of the gate electrode G2 on the source region SR2 side and the drain region DR2 side of the logic MISFET (TR2).

Furthermore, over each sidewall of the gate electrode G2 of the logic MISFET (TR2), the insulating film SWL1 and the insulating film SWL2 are layered in this order. The insulating film SWL1 is formed along the sidewall of the gate electrode G2 and the main surface of the semiconductor substrate SUB. The offset spacer film OSF2 is interposed between the insulating film SWL1 and the gate electrode G2; however, the offset spacer film OSF2 is not interposed between the insulating film SWL1 and the main surface of the semiconductor substrate SUB.

The insulating film SWL2 is formed to be thicker than the insulating film SWL1. To be described later, the insulating film SWL1 and the insulating film SWL2 constitute a sidewall insulating film SW2 having a predetermined width in the direction vertical to the sidewall of the gate electrode G2. Ion implantation for forming the high-concentration semiconductor region SD2 is performed by using the sidewall insulating film SW2 left on the sidewall of the gate electrode G2 as a mask. That is, the high-concentration semiconductor region SD2 is formed against the sidewall insulating film SW2 in a self-aligned manner.

The sidewall insulating film SW2 formed over the sidewall of the gate electrode G2 of the logic MISFET (TR2) and the sidewall insulating film SW1 formed over the sidewall of the gate electrode G1 of the selection MISFET (TR1) are formed in the same step, and have the same width. However, the width of the sidewall insulating film SW1 formed over the sidewall of the gate electrode G1 of the selection MISFET (TR1) may be greater or wider than the width of the sidewall insulating film SW2 formed over the sidewall of the gate electrode G2 of the logic MISFET (TR2). In this case, leakage current in the source region SR1 and the drain region DR1 of the selection MISFET (TR1) can be further reduced.

In the logic MISFET (TR2), the silicide layer SLD is formed on an upper surface of the gate electrode G2. Each front surface of the high-concentration semiconductor regions SD2 serving as the source region SR2 and the drain region DR2 is also covered with the silicide layer SLD.

Furthermore, also the logic MISFET (TR2) is covered with the stress liner film SL. The stress liner film SL is formed of an insulating film such as a silicon nitride film, has stress enough to apply tensile stress to a channel formation region of the logic MISFET (TR2), and improves current driving capability of the logic MISFET (TR2).

The interlayer insulating film INS1 is formed over the semiconductor substrate SUB so as to cover the stress liner film SL. A plurality of first openings are formed in the interlayer insulating film INS1 and the stress liner film SL so as to penetrate the films INS1 and SL. A plug electrode PLUG1 is formed in each of the first openings. Incidentally, the plug electrode PLUG1 is connected to the source region SR2 and the drain region DR2 of the logic MISFET (TR2) via the silicide layer SLD.

The interlayer insulating film INS2 is formed on the interlayer insulating film INS1. The interlayer insulating film INS2 covers the plurality of plug electrodes PLUG1 exposed to the front surface of the interlayer insulating film INS1. The interlayer insulating film INS3 is formed on the interlayer insulating film INS2. The interlayer insulating film INS3 and the interlayer insulating film INS2 are provided with a plurality of third openings penetrating the interlayer insulating films INS3 and INS2. A plug electrode PLUG2 is formed in the third opening. The plug electrode PLUG2 is stacked on the plug electrode PLUG1 so as to electrically connect to the plug electrode PLUG1 connected to the source region SR2 and the drain region DR2 of the logic MISFET (TR2).

The interlayer insulating film INS4 is formed on the interlayer insulating film INS3. The interlayer insulating film INS4 is formed to cover the plurality of plug electrodes PLUG2 exposed to the front surface of the interlayer insulating film INS3. The interlayer insulating film INS4 is provided with a plurality of fourth openings, and the fourth opening is filled with the plug electrode PLUG3. The plug electrode PLUG3 is stacked on the plug electrode PLUG2 positioned under the plug electrode PLUG3.

Although illustration is omitted, an interlayer insulating film and a metal film are further formed on the interlayer insulating film INS4 and the plug electrode PLUG3, and thus, a multilayer wiring structure is formed.

Next, a method for manufacturing the semiconductor device according to the present embodiment will be described.

Figure 3:
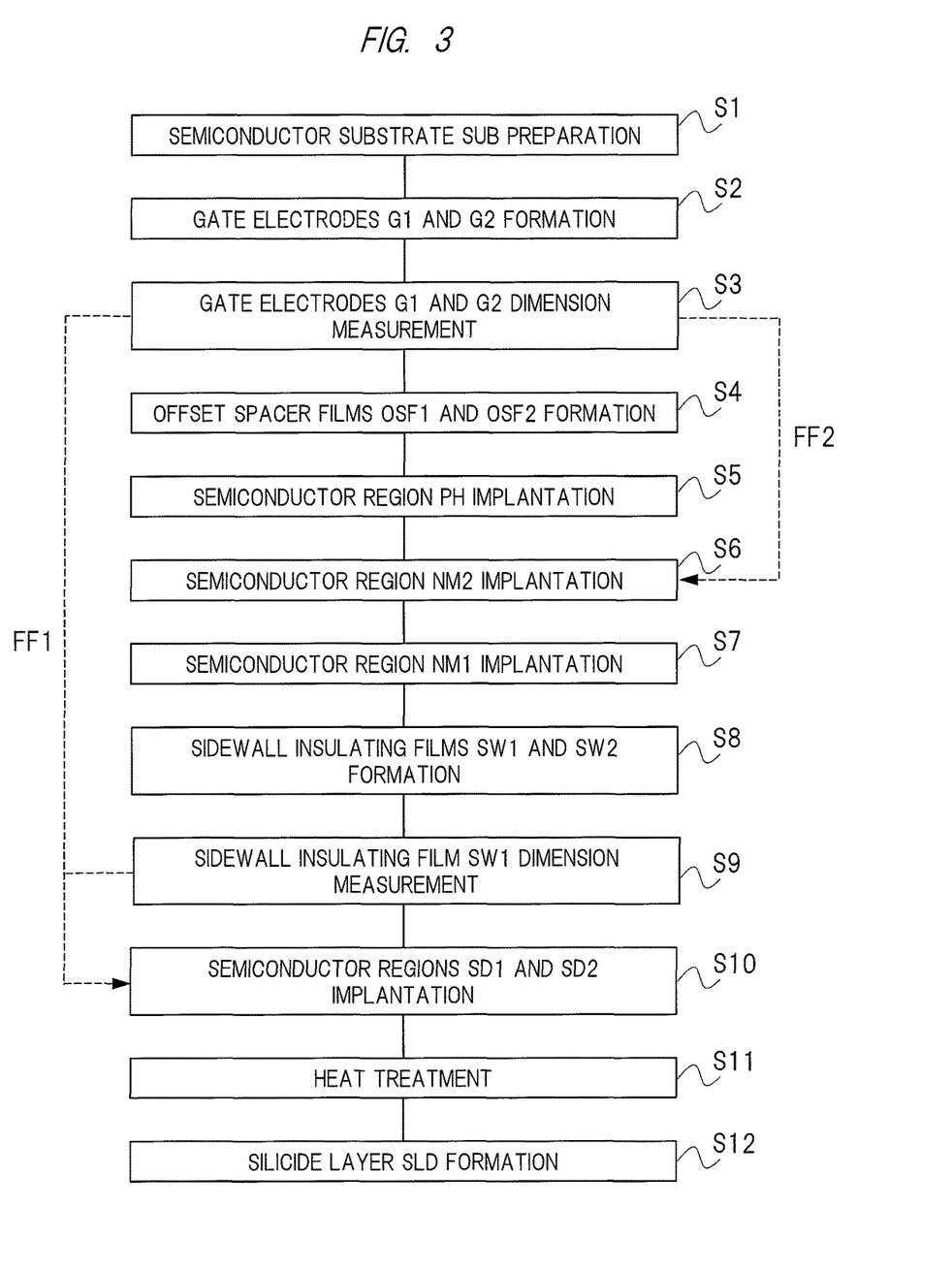
FIG. 3 is a process flow diagram illustrating a part of the manufacturing process of the semiconductor device according to the present embodiment.

FIG. 3 is a process flow diagram illustrating a part of the manufacturing process of the semiconductor device according to the present embodiment. FIGS. 4 to 11 are cross-sectional views of main parts of the semiconductor device according to the present embodiment during the manufacturing process.

First, design dimensions of the selection MISFET (TR1) and the logic MISFET (TR2) and initial setting conditions in the manufacturing process are determined. Examples of the design dimensions and the initial setting conditions include various items such as the gate lengths of the gate electrodes G1 and G2 of the selection MISFET (TR1) and the logic MISFET (TR2), the widths of the sidewall insulating films SW1 and SW2, impurity dosages, ion implantation angles, and the like for the low-concentration semiconductor regions NM1 and NM2 and the high-concentration semiconductor regions SD1 and SD2, which are formed by ion implantation.

Next, a "semiconductor substrate SUB preparation" step S1 illustrated in the process flow in FIG. 3 is executed. An example of the semiconductor substrate SUB is a disc made of p-type silicon and has a main surface and a back surface. Next, the element separation film STI defining active regions where the selection MISFETs (TR1) and the logic MISFET (TR2) are formed is formed on the main surface side of the semiconductor substrate SUB. The element separation film STI is formed by forming element separation trenches in the semiconductor substrate SUB, embedding an insulating film (for example, a silicon oxide film) into the element separation trenches, and polishing the insulating film by using the CMP technique or the like such that a height of a front surface of the insulating film is nearly identical to a height of the front surface of the semiconductor substrate SUB.

Next, the gate insulating film GI1 and the gate insulating film GI2 are formed on the front surface of the semiconductor substrate SUB. The gate insulating film GI1 and the gate insulating film GI2 are formed in the same step and have the same film thickness. The gate insulating film GI1 and the gate insulating film GI2 are made of a silicon oxide film, a silicon oxynitride film, or the like. Here, the film thickness of the gate insulating film GI1 may be set to be greater than the film thickness of the gate insulating film GI2 in order to reduce leakage current of the DRAM cell.

Figure 4:
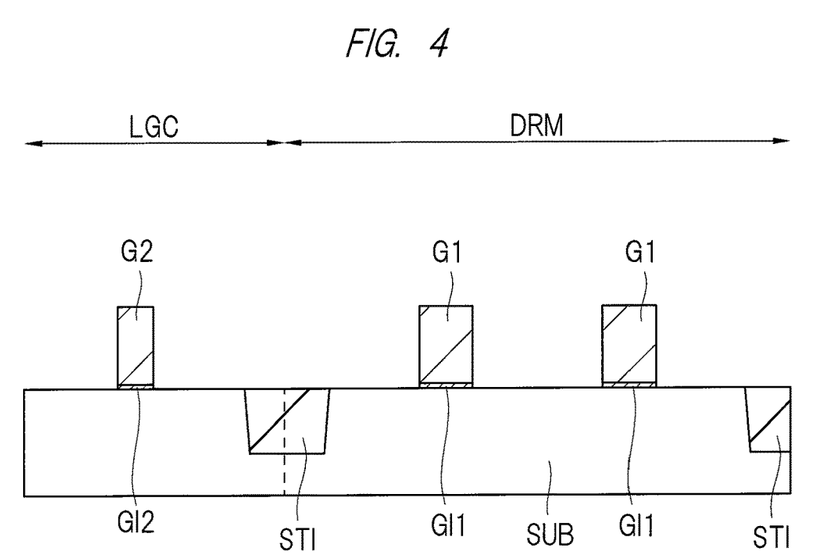
FIG. 4 is a cross-sectional view of main parts of the semiconductor device according to the present embodiment during the manufacturing process.

Next, a "gate electrodes G1 and G2 formation" step S2 illustrated in the process flow in FIG. 3 is executed. A conductor film made of a polycrystalline silicon film is deposited on the gate insulating films GI1 and GI2, and the conductor film is patterned. Thus, the gate electrode G1 is formed via the gate insulating film GI1, and the gate electrode G2 is formed via the gate insulating film GI2 over the main surface of the semiconductor substrate SUB, as illustrated in FIG. 4. A known photolithography method or a known dry etching method is used for patterning the conductor film.

Next, a "gate electrodes G1 and G2 dimension measurement" step S3 illustrated in the process flow in FIG. 3 is executed. The gate lengths of the gate electrodes G1 and G2 after being processed are measured, for example, by using a scanning electron microscope (SEM) or the like, and the processed dimensions of the gate electrodes G1 and G2 are obtained. Note that, in the "gate electrodes G1 and G2 formation" step S2, although the gate electrodes G1 and G2 are processed according to the above-mentioned design dimensions, the gate lengths of the gate electrodes after being processed have subtle processing errors with respect to the design dimensions, depending on the processing accuracy of the photolithography method or the dry etching method. Therefore, it is important to obtain the gate lengths (processed dimensions) of the gate electrodes G1 and G2 after being processed, and to feed forward (FF1 and FF2) the obtained data to the subsequent manufacturing process.

Figure 5:
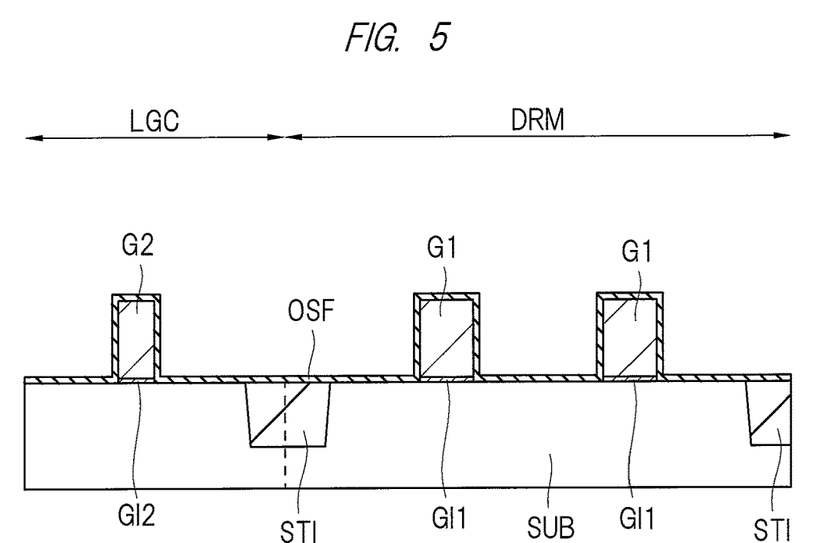
FIG. 5 is a cross-sectional view of main parts of the semiconductor device subsequent to FIG. 4 during the manufacturing process.

Next, an "offset spacer films OSF1 and OSF2 formation" step S4 illustrated in the process flow in FIG. 3 is executed. As illustrated in FIG. 5, an offset spacer film OSF is formed over the semiconductor substrate SUB. The offset spacer film OSF is a silicon oxide film, and is formed to cover the upper surfaces and side surfaces of the gate electrodes G1 and G2 by the CVD or the ALD, for example.

Figure 6:
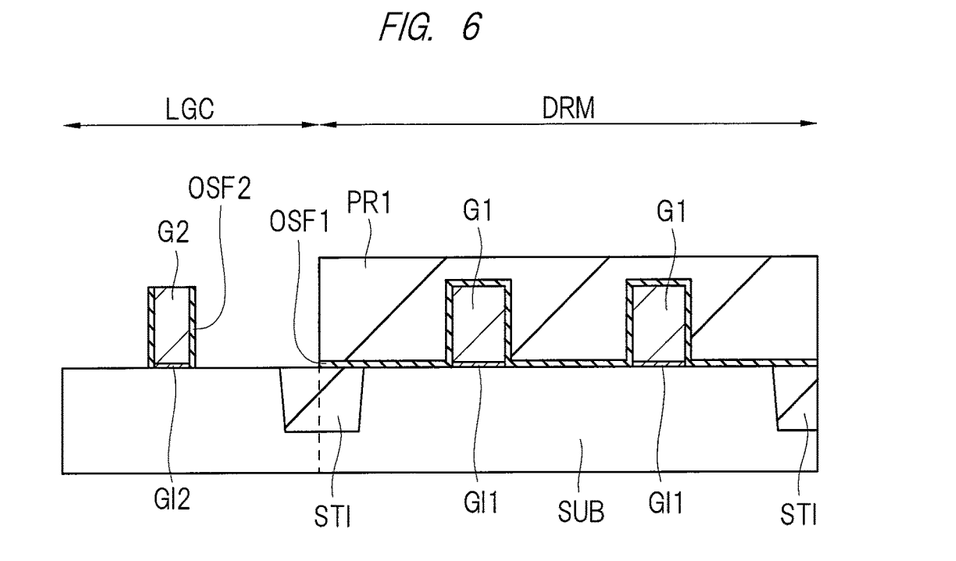
FIG. 6 is a cross-sectional view of main parts of the semiconductor device subsequent to FIG. 5 during the manufacturing process.

Next, as illustrated in FIG. 6, a photoresist film PR1 selectively covering the logic circuit region LGC is formed on the offset spacer film OSF. Furthermore, anisotropic etching is performed on the offset spacer film OSF by using the photoresist film PR1 as a mask, and the offset spacer film OSF2 is selectively formed only on the sidewalls of the gate electrode G2 in the logic circuit region LGC. On the entire region of the DRAM region DRM, the deposited offset spacer film OSF is left as it is. That is, the first offset spacer film OSF1 is formed which covers the upper surface and the sidewalls of the gate electrodes G1, and furthermore, covers the main surface of the semiconductor substrate SUB and the front surface of the element separation film STI.

Figure 7:
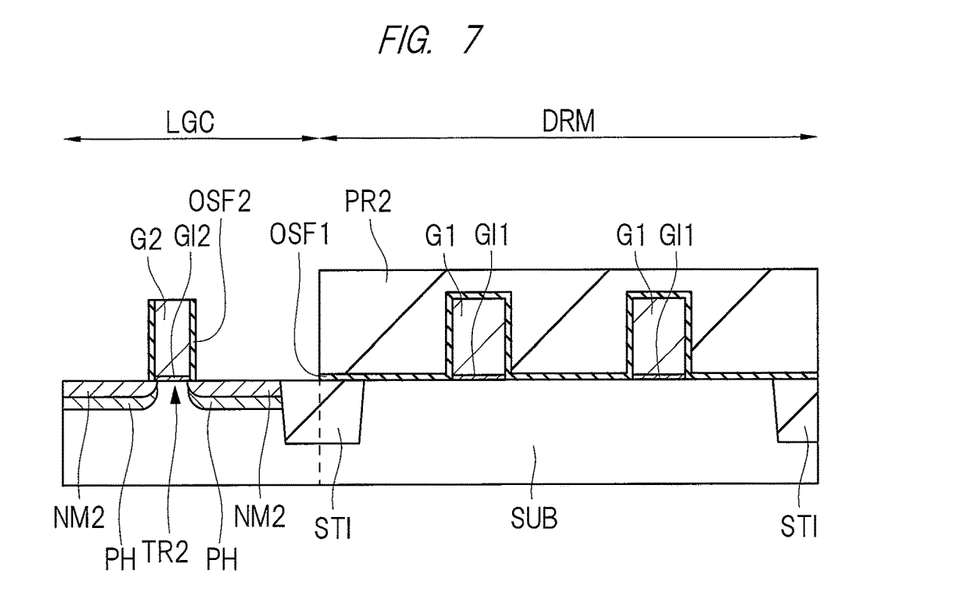
FIG. 7 is a cross-sectional view of main parts of the semiconductor device subsequent to FIG. 6 during the manufacturing process.

Next, a "semiconductor region PH implantation" step S5 and a "semiconductor region NM2 implantation" step S6 illustrated in the process flow in FIG. 3 are executed. As illustrated in FIG. 7, a photoresist film PR2 covering the DRAM region DRM and exposing the logic circuit region LGC is formed over the semiconductor substrate SUB. In the "semiconductor region PH implantation" step S5, the semiconductor region PH is formed by implanting ions of a p-type impurity (for example, boron) into the logic circuit region LGC by using the resist film PR2 as a mask. Here, for example, the dosage of the p-type impurity is $3.4 \times 10^{13}$ atom/cm$^2$ (BF2), and the ion implantation angle (inclination angle with respect to the normal line of the main surface of the semiconductor substrate SUB, the same applies hereinafter) is 7°.

Next, in the "semiconductor region NM2 implantation" step S6, the low-concentration semiconductor region NM2 of the logic MISFET (TR2) is formed by implanting ions of an n-type impurity (for example, phosphorus or arsenic) by using the resist film PR2 as a mask. By implanting ions of the n-type impurity from outside the offset spacer film OSF2, the overlapping amount between the low-concentration semiconductor region NM2 and the gate electrode G2 can be reduced. Therefore, the gate length of the logic MISFET (TR2) can be reduced. Here, in the initial setting conditions for ion implantation, the dosage of arsenic as the impurity is $1.0 \times 10^{15}$ atom/cm$^2$ and the ion implantation angle is 3°.

In the present embodiment, the processed dimensions of the gate electrode G2 obtained in the "gate electrodes G1 and G2 dimension measurement" step S3 are fed forward (FF2) to the "semiconductor region NM2 implantation" step S6, and ion implantation execution conditions are reset. That is, by determining a deviation between the processed dimensions of the gate electrode G2 and the design dimensions, resetting the ion implantation execution conditions according to the deviation, and thus forming the low-concentration semiconductor region NM2, a variation in processing of the gate electrode G2 is made up with the ion implantation step. Therefore, electrical characteristics of the logic MISFET (TR2) can be improved. Specifically, a variation in threshold voltage of the logic MISFET (TR2) can be reduced, and high-speed operation of the logic circuit is enabled. For example, in a case where the processed dimensions of the gate electrode G2 are greater than the design dimensions, the ion implantation execution conditions are reset by using a technique such as increasing the dosage, increasing the ion implantation angle, or increasing the dosage and the ion implantation angle. In contrast, in a case where the processed dimensions of the gate electrode G2 are smaller than the design dimensions, the ion implantation execution conditions are reset by using a technique such as decreasing the dosage, decreasing the ion implantation angle, or decreasing the dosage and the ion implantation angle.

Incidentally, in the case where the processed dimensions are greater than the design dimensions, for example, the dosage is increased to 1.5 to $2.5 \times 10^{15}$ atom/cm$^2$, or the ion implantation angle is increased to 6°. In the case where the processed dimensions are smaller than the design dimensions, for example, the dosage is decreased to 0.2 to $0.5 \times 10^{15}$ atom/cm$^2$, or the ion implantation angle is decreased to 0°.

Figure 8:
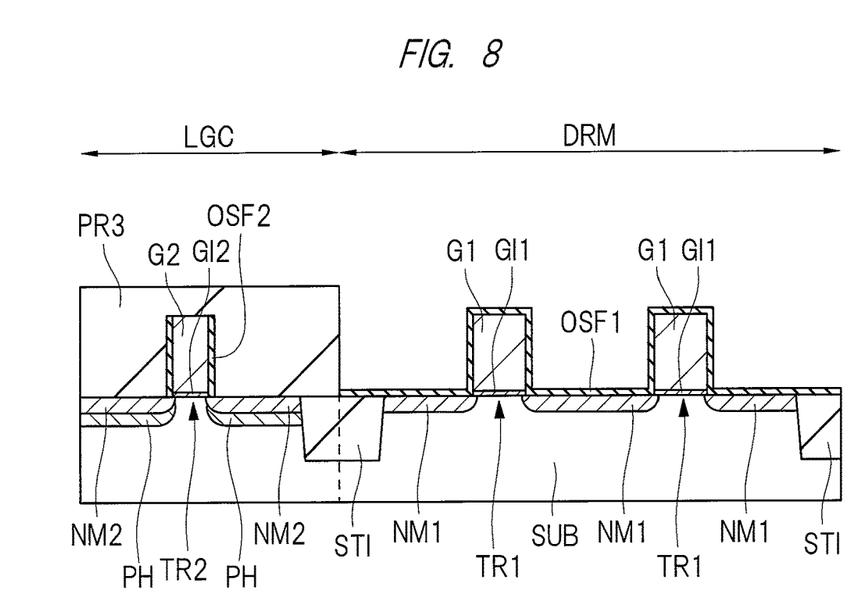
FIG. 8 is a cross-sectional view of main parts of the semiconductor device subsequent to FIG. 7 during the manufacturing process.

Next, a "semiconductor region NM1 implantation" step S7 illustrated in the process flow in FIG. 3 is executed. As illustrated in FIG. 8, a resist film PR3 covering the logic circuit region LGC and exposing the DRAM region DRM is formed on the main surface of the semiconductor substrate SUB. The low-concentration semiconductor region NM1 of the selection MISFET (TR1) is formed by implanting ions of an n-type impurity (for example, phosphorus or arsenic) into the DRAM region DRM by using the resist film PR3 as a mask. For example, ions of phosphorus as the impurity are implanted under the conditions where the dosage is $2 \times 10^{12}$ atom/cm$^2$ and the ion implantation angle is 3°. By implanting ions of the n-type impurity from outside the offset spacer film OSF1, the overlapping amount between the low-concentration semiconductor region NM1 and the gate electrode G1 can be reduced. Therefore, the gate length of the selection MISFET (TR1) can be reduced. Here, the dosage for the low-concentration semiconductor region NM1 of the selection MISFET (TR1) is about three orders of magnitude lower than the dosage for the low-concentration semiconductor region NM2 of the logic MISFET (TR2). That is, a sheet resistance of the low-concentration semiconductor region NM1 of the selection MISFET (TR1) is higher than a sheet resistance of the low-concentration semiconductor region NM2 of the logic MISFET (TR2) in order to reduce the leakage current of the DRAM cell. Note that, in FIG. 3, the step S6 may be executed after the step S7.

Figure 9:
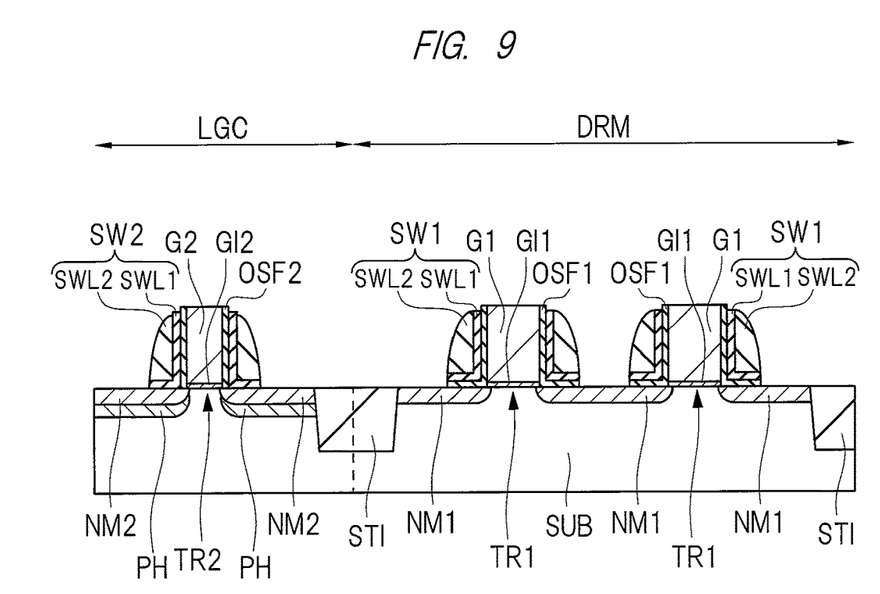
FIG. 9 is a cross-sectional view of main parts of the semiconductor device subsequent to FIG. 8 during the manufacturing process.

Next, a "sidewall insulating film SW1 formation" step S8 illustrated in the process flow in FIG. 3 is executed. The photoresist film PR3 is removed, and then, the insulating film SWL1 and the insulating film SWL2 are deposited over the semiconductor substrate SUB in this order. The insulating film SWL1 is made of a silicon nitride film, the insulating film SWL2 is made of a silicon oxide film, and both the insulating films SWL1 and SWL2 are formed by the CVD or the ALD. Note that the insulating film SWL1 may be made of a silicon oxide film and the insulating film SWL2 may be made of a silicon nitride film. Next, anisotropic etching is performed on the layered insulating films SWL1 and SWL2, and the sidewall insulating films SW1 and SW2 are formed over the respective sidewalls of the gate electrodes G1 and G2 as illustrated in FIG. 9. Since anisotropic etching is simultaneously performed on the insulating films SWL1 and SWL2 in the DRAM region DRM and the logic circuit region LGC, the widths of the sidewall insulating films SW1 and SW2 are identical. In addition, anisotropic etching may be separately performed on each of the layered insulating films SWL1 and SWL2 in the DRAM region DRM and the logic circuit region LGC, and the width of the sidewall insulating film SW1 may be greater than the width of the sidewall insulating film SW2. Conversely, the width of the sidewall insulating film SW1 may be smaller than the width of the sidewall insulating film SW2.

Next, a "sidewall insulating film SW1 dimension measurement" step S9 illustrated in the process flow in FIG. 3 is executed. The width of the sidewall insulating film SW1 after being processed in the selection MISFET (TR1) is measured, for example, by the SEM or the like, and the processed dimension of the sidewall insulating film SW1 is obtained. The width of the sidewall insulating film SW1 is processed according to the above-mentioned design dimensions; however, the width of the sidewall insulating film SW1 after being processed has a subtle processing error with respect to the design dimensions, depending on the film deposition accuracy of the insulating films SWL1 and SWL2 or the processing accuracy in dry etching. Therefore, it is important to obtain the width (processed dimension) of the sidewall insulating film SW1 after being processed. The dimension of the sidewall insulating film SW1 is the width of the sidewall insulating film SW1 constituted by the insulating films SWL1 and SWL2; however, in a strict sense, the width obtained by adding the film thickness of the offset spacer film OSF1 to the width of the sidewall insulating film SW1 is preferably measured.

Figure 10:
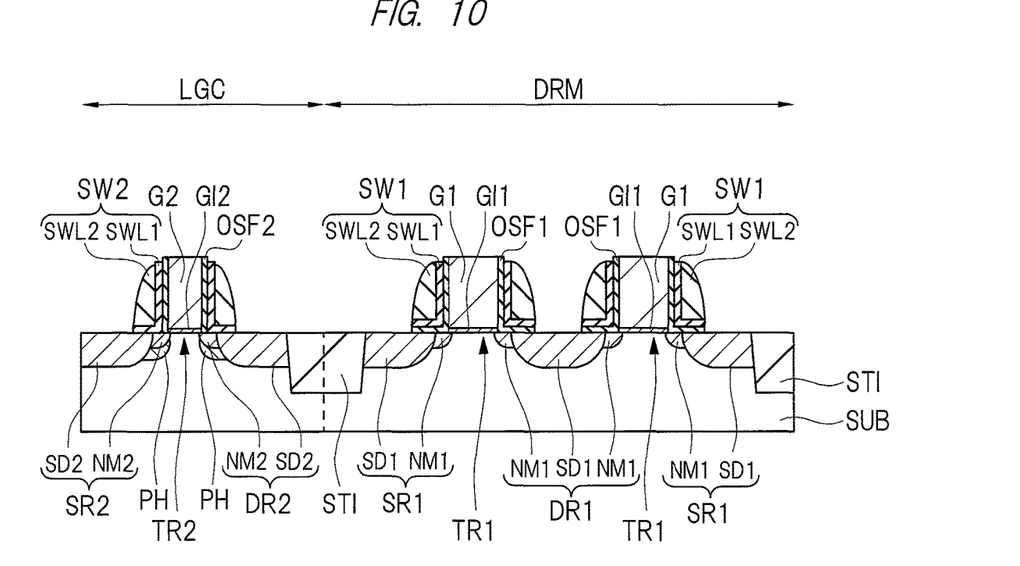
FIG. 10 is a cross-sectional view of main parts of the semiconductor device subsequent to FIG. 9 during the manufacturing process.

Next, a "semiconductor regions SD1 and SD2 implantation" step S10 illustrated in the process flow in FIG. 3 is executed. As illustrated in FIG. 10, the high-concentration semiconductor regions SD1 and SD2 are formed by implanting ions of an n-type impurity (for example, phosphorus or arsenic) into the main surface of the semiconductor substrate SUB by using the gate electrodes G1 and G2, the offset spacer films OSF1 and OSF2, and the sidewall insulating films SW1 and SW2 as masks. In the initial setting conditions for ion implantation, the dosage of arsenic as the impurity is $2.8 \times 10^{13}$ atom/cm$^2$, and the ion implantation angle is 3°.

In the present embodiment, the processed dimension of the gate electrode G1 obtained in the "gate electrodes G1 and G2 dimension measurement" step S3 and the processed dimension of the sidewall insulating film SW1 obtained in the "sidewall insulating film SW1 dimension measurement" step S9 are fed forward (FF1) to the "semiconductor regions SD1 and SD2 implantation" step S10, and the ion implantation execution conditions are reset. That is, by determining a deviation between the processed dimension and the design dimension, resetting the ion implantation execution conditions according to the deviation, and thus forming the high-concentration semiconductor region SD1, variations in processing of the gate electrode G1 and the sidewall insulating film SW1 are made up with the ion implantation step. Therefore, the electrical characteristic of the selection MISFET (TR1) can be improved. Specifically, a variation in on-current of the selection MISFET (TR1) can be reduced, and the writing or reading characteristic of the DRAM cell can be improved. For example, in a case where the sum (ADDF) of the processed dimension of the gate electrode G1 and the processed dimension of the sidewall insulating film SW1 is greater than the sum (ADDI) of the design dimension of the gate electrode G1 and the design dimension of the sidewall insulating film SW1, the ion implantation execution conditions are reset by using a technique such as increasing the dosage, increasing the ion implantation angle, or increasing the dosage and the ion implantation angle. In contrast, in a case where the sum (ADDF) of the processed dimensions is smaller than the sum (ADDI) of the design dimensions, the ion implantation execution conditions are reset by using a technique such as decreasing the dosage, decreasing the ion implantation angle, or decreasing the dosage and the ion implantation angle.

Incidentally, in the case where the sum (ADDF) of the processed dimensions is greater than the sum (ADDI) of the design dimensions, for example, the dosage is increased to 4.0 to $5.0 \times 10^{15}$ atom/cm$^2$ or the ion implantation angle is increased to 6°. Also, in the case where the sum (ADDF) of the processed dimensions is smaller than the sum (ADDI) of the design dimensions, for example, the dosage is decreased to 1.0 to 2.0×10$^{15}$ atom/cm$^2$ or the ion implantation angle is decreased to 0°.

Next, a "heat treatment" step S11 illustrated in the process flow in FIG. 3 is executed. Here, the semiconductor substrate SUB is subjected to a heat treatment in order to diffuse and activate the implanted impurity ions. For example, lamp annealing for about five seconds is performed, for example, at a temperature between 1040° C. and 1050° C.

Figure 11:
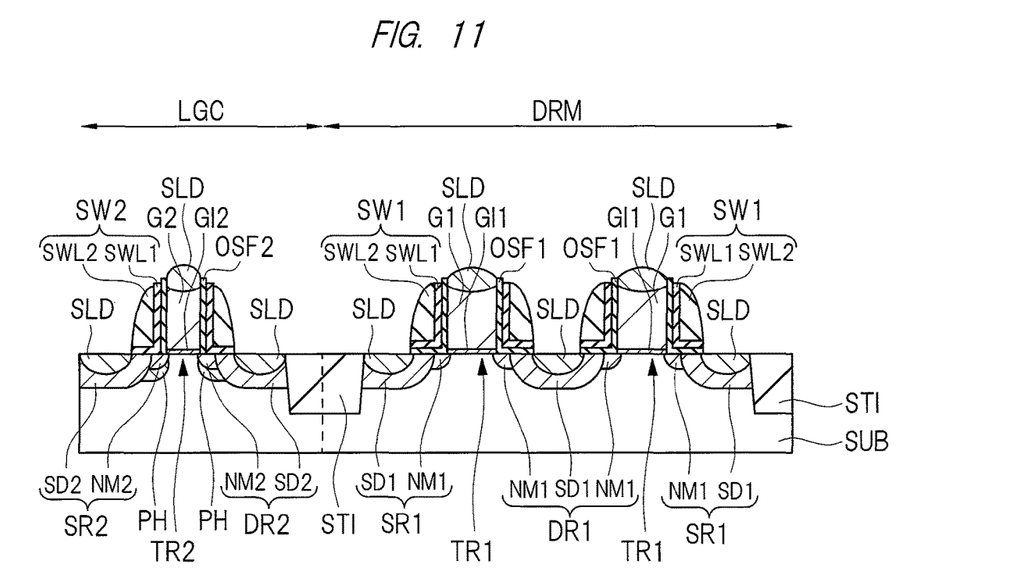
FIG. 11 is a cross-sectional view of main parts of the semiconductor device subsequent to FIG. 10 during the manufacturing process.

Next, a "silicide layer SLD formation" step S12 illustrated in the process flow in FIG. 3 is executed. As illustrated in FIG. 11, the silicide layer SLD is formed on the front surface of the gate electrode G1 and each front surface of the high-concentration semiconductor regions SD1 of the source region SR1 and the drain region DR1 in the selection MISFET (TR1). Furthermore, the silicide layer SLD is formed on the front surface of the gate electrode G2 and each front surface of the high-concentration semiconductor regions SD2 of the source region SR2 and the drain region DR2 in the logic MISFET (TR2). For example, the silicide layer SLD is constituted by a cobalt silicide (CoSi) layer, a nickel silicide (NiSi) layer, a platinum (Pt)-containing nickel silicide (NiSi) layer, or the like.

Next, as illustrated in FIG. 2, the stress liner film SL is formed over the semiconductor substrate SUB so as to cover the gate electrodes G1 and G2. The stress liner film SL is formed of an insulating film such as a silicon nitride film, and is formed, for example by the plasma CVD.

Next, the interlayer insulating film INS1 is formed on the stress liner film SL. The interlayer insulating film INS1 is provided with the plurality of first openings exposing the source region SR1 and the drain region DR1 of the selection MISFET (TR1) and the source region SR2 and the drain region DR2 of the logic MISFET (TR2). In the DRAM region DRM, the first opening penetrates the interlayer insulating film INS1 and the stress liner film SL. The first opening is filled with the plug electrode PLUG1. In the logic circuit region LGC, the first opening penetrates the interlayer insulating film INS1 and the stress liner film SL, and the first opening is filled with the plug electrode PLUG1. For example, the plug electrode PLUG1 is formed of a layered film including a titanium nitride (TiN) film of a lower layer and a tungsten (W) film of an upper layer.

Then, the interlayer insulating film INS2, the bit line BL, the interlayer insulating film INS3, the plug electrode PLUG2, and the interlayer insulating film INS4 are formed. Subsequently, the fourth opening for forming the capacitive element CON is formed, and the lower electrode EL1, the capacitive film CINS, and the upper electrodes EL2 and EL3 are formed in the fourth opening. Furthermore, after the fourth opening is formed in the logic circuit region LGC, the plug electrode PLUG 3 is formed. The plug electrodes PLUG2 and PLUG3 are formed of the same material and formed to have the same structure as the material and the structure of the plug electrode PLUG1.

For example, each of the interlayer insulating films INS1 to INS4 is formed of a silicon oxide film or a Low-k film, or has a structure where the silicon oxide film and the Low-k film are layered. Each of the photoresist films PR1 to PR3 is made of, for example, novolac resin, and is naturally photosensitive.

Note that, even though the semiconductor devices according to the present embodiment are formed in a plurality of semiconductor wafers by following the above-described manufacturing method, the "gate electrodes G1 and G2 dimension measurement" step S3 and the "sidewall insulating film SW1 dimension measurement" step S9 are executed for each semiconductor wafer to be processed in the process flow diagram illustrated in FIG. 3. Resetting of the ion implantation executing conditions in the "semiconductor region NM2 implantation" step S6 and the "semiconductor regions SD1 and SD2 implantation" step S10 is also executed for each semiconductor wafer to be processed. The other steps are executed for the plurality of semiconductor wafers with the common design dimensions and under the initial setting conditions.

Next, main features and effects of the present embodiment will be described.

A feature of the present embodiment is as follows. The gate length (processed dimension) of the gate electrode G1 of the selection MISFET (TR1) and the width (processed dimension) of the sidewall insulating film SW1 of the selection MISFET (TR1) are measured, and the deviations between the processed dimensions and the design dimensions of the gate electrode G1 and the sidewall insulating film SW1 are fed forward (FF1) to the ion implantation step for the high-concentration semiconductor region SD1 of the selection MISFET (TR1). That is, based on the above deviations, the ion implantation execution conditions for the high-concentration semiconductor region SD1 of the selection MISFET (TR1) are reset, ion implantation is executed based on the execution conditions, and thus, the high-concentration semiconductor region SD1 is formed.

Due to the above feature, variations in the electrical characteristics of the selection MISFET (TR1) due to variations in processing of the gate electrode G1 and the sidewall insulating film SW1 among the semiconductor wafers can be reduced. In particular, variations in threshold voltage and on-current of the selection MISFET (TR1) can be reduced, and the writing or reading characteristic of the DRAM cell can be improved.

In addition, a feature of the present embodiment is as follows. The gate length (processed dimension) of the gate electrode G1 of the selection MISFET (TR1) and the width (processed dimension) of the sidewall insulating film SW1 of the selection MISFET (TR1) are measured, and the deviations between the processed dimensions and the design dimensions of the gate electrode G1 and the sidewall insulating film SW1 are fed forward (FF1) to the ion implantation step for the high-concentration semiconductor region SD1 of the selection MISFET (TR1). Based on the above deviations, the ion implantation execution conditions for the high-concentration semiconductor region SD1 of the selection MISFET (TR1) are reset, ion implantation is executed based on the execution conditions, and thus, the high-concentration semiconductor region SD1 is formed. Furthermore, the gate length (processed dimension) of the gate electrode G2 of the logic MISFET (TR2) is measured, and the deviation between the processed dimension and the design dimension of the gate electrode G2 is fed forward (FF2) to the ion implantation step for the low-concentration semiconductor region NM2 of the logic MISFET (TR2). Based on the above deviation, the ion implantation execution conditions for the low-concentration semiconductor region NM2 of the logic MISFET (TR2) is reset, ion implantation is executed based on the execution conditions, and thus, the low-concentration semiconductor region NM2 is formed.

Due to the above feature, variations in the electrical characteristics of the selection MISFET (TR1) can be reduced as described above. In addition, variations in the electrical characteristics of the logic MISFET (TR2) due to variations in processing of the gate electrode G2 among the semiconductor wafers can be reduced. In particular, variations in threshold voltage of the logic MISFET (TR2) can be reduced, so that operation speed of the logic circuit can be made higher and the power consumption of the logic circuit can be lowered.

In the eDRAM according to the present embodiment, the feed-forward process executed in the selection MISFET (TR1) constituting the DRAM cell differs from the feed-forward process executed in the logic MISFET (TR2) constituting the logic circuit. Accordingly, the high-performance eDRAM with little variation in electrical characteristics among the semiconductor wafers can be realized. In the logic MISFET (TR2), since an effective channel length determining the threshold voltage and the on-current is a distance between the low-concentration semiconductor regions NM2, it is important to feed forward (FF2) the variation in processing of the gate electrode G2 to ion implantation for the low-concentration semiconductor region NM2. In contrast, in the selection MISFET (TR1), the dosage for the low-concentration semiconductor region NM1 is about three orders of magnitude lower than the dosage for the low-concentration semiconductor region NM2 of the logic MISFET (TR2), and the dosage for the high-concentration semiconductor region SD1 is nearly identical to the dosage for the low-concentration semiconductor region NM2 of the logic MISFET (TR2). That is, since an effective channel length determining the threshold voltage and the on-current of the selection MISFET (TR1) is a distance between the high-concentration semiconductor regions SD1, it is important to feed forward (FF1) the variations in processing of the gate electrode G1 and the sidewall insulating film SW1 to ion implantation for the high-concentration semiconductor region SD1.

In the foregoing, the invention made by the inventor of the present invention has been concretely described based on the embodiment. However, it is needless to say that the present invention is not limited to the foregoing embodiment and various modifications and alterations can be made within the scope of the present invention.

What is claimed is:

1. A method for manufacturing a semiconductor device including a DRAM cell configured to include a MISFET having a gate electrode, a source region, and a drain region, and a capacitive element connected in series to one of the source region and the drain region of the MISFET, the MISFET having a first sidewall insulating film over a sidewall of the gate electrode, and one of the source region and the drain region including a first semiconductor region with a relatively low impurity concentration and a second semiconductor region with a relatively high impurity concentration, the method comprising:
    (a) determining a first design dimension of the gate electrode and a second design dimension of the first sidewall insulating film along a first direction from the source region to the drain region, and initial setting conditions for ion implantation for forming the second semiconductor region, the initial setting conditions including an initial dosage and an initial implantation angle for the ion implantation for forming the second semiconductor region;
    (b) after (a), forming the gate electrode over a main surface of a semiconductor substrate according to the first design dimension;
    (c) after (b), measuring a first processed dimension of the gate electrode along the first direction;
    (d) after (c), implanting ions of a first impurity of a first conductivity type into the main surface of the semiconductor substrate in order to form the first semiconductor region at each end of the gate electrode;
    (e) after (d), forming the first sidewall insulating film over the sidewall of the gate electrode;
    (f) after (e), measuring a second processed dimension of the first sidewall insulating film along the first direction; and
    (g) after (f), implanting ions of a second impurity of the first conductivity type into the main surface of the semiconductor substrate in order to form the second semiconductor region at each end of the gate electrode and the first sidewall insulating film,
    wherein, in (g), at least one of dosage and ion implantation angle for executing the implanting ions of the second impurity is reset from the initial setting conditions according to a deviation of the first processed dimension from the first design dimension and a deviation of the second processed dimension from the second design dimension, and then the implanting ions of the second impurity is executed.

2. The method for manufacturing the semiconductor device according to claim 1,
    wherein the at least one of dosage and ion implantation angle for executing the implanting ions in (g) is reset according to a deviation of a sum of the first processed dimension and the second processed dimension from a sum of the first design dimension and the second design dimension.

3. The method for manufacturing the semiconductor device according to claim 2,
    wherein, in a case where the sum of the first processed dimension and the second processed dimension is greater than the sum of the first design dimension and the second design dimension, the ion implantation angle is reset to be greater than the initial implantation angle set in the initial setting conditions.

4. The method for manufacturing the semiconductor device according to claim 2,
    wherein, in a case where the sum of the first processed dimension and the second processed dimension is greater than the sum of the first design dimension and the second design dimension, the dosage is reset to be greater than the initial dosage set in the initial setting conditions.

5. The method for manufacturing the semiconductor device according to claim 1,
    wherein a first sidewall spacer has a structure in which a second sidewall insulating film and the first sidewall insulating film are layered, and
    the second sidewall insulating film is formed over the sidewall of the gate electrode between (c) and (d), and the first sidewall insulating film is formed on the second sidewall insulating film between (d) and (f).

6. The method for manufacturing the semiconductor device according to claim 5,
    wherein the ions of the first impurity are implanted into the main surface of the semiconductor substrate from outside the gate electrode and the second sidewall insulating film in (d).

7. The method for manufacturing the semiconductor device according to claim 1,
    wherein (c), (f), and (g) are individually performed for each of a plurality of semiconductor wafers.

8. The method for manufacturing the semiconductor device according to claim 1, further comprising, after (g), forming the capacitive element over the MISFET.

9. The method for manufacturing the semiconductor device according to claim 1, further comprising, after (g), forming a silicide layer at an exposed surface of the second semiconductor region.

10. The method for manufacturing the semiconductor device according to claim 1, wherein, after (g), the first semiconductor region is between and in contact with the second semiconductor region and a channel region of the semiconductor substrate, which is below the gate electrode.

11. A method for manufacturing a semiconductor device including a memory region including a DRAM cell configured to include a first MISFET having a first gate electrode, a first source region and a first drain region, and a capacitive element connected in series to the first MISFET, and a logic circuit region including a second MISFET having a second gate electrode, a second source region and a second drain region, the first MISFET having a first sidewall insulating film over a sidewall of the first gate electrode, one of the first source region and the first drain region including a first semiconductor region with a relatively low impurity concentration and a second semiconductor region with a relatively high impurity concentration, and one of the second source region and the second drain region of the second MISFET including a third semiconductor region with a relatively low impurity concentration and a fourth semiconductor region with a relatively high impurity concentration, the method comprising:

(a) determining a first design dimension of the first gate electrode and a second design dimension of the first sidewall insulating film along a first direction from the first source region to the first drain region, and first initial setting conditions for ion implantation for forming the second semiconductor region, the first initial setting conditions including a first initial dosage or a first initial implantation angle for the ion implantation for forming the second semiconductor region;

(b) determining a third design dimension of the second gate electrode along the first direction and second initial setting conditions for ion implantation for forming the third semiconductor region, the second initial setting conditions including a second initial dosage or a second initial implantation angle for the ion implantation for forming the third semiconductor region;

(c) forming the first gate electrode and the second gate electrode over a main surface of a semiconductor substrate according to the first design dimension and the third design dimension;

(d) measuring a first processed dimension of the first gate electrode and a second processed dimension of the second gate electrode along the first direction;

(e) implanting ions of a first impurity of a first conductivity type into the main surface of the semiconductor substrate in order to form the third semiconductor region at each end of the second gate electrode;

(f) implanting ions of a second impurity of the first conductivity type into the main surface of the semiconductor substrate in order to form the first semiconductor region at each end of the first gate electrode;

(g) forming the first sidewall insulating film over the sidewall of the first gate electrode and forming a second sidewall insulating film over a sidewall of the second gate electrode;

(h) measuring a third processed dimension of the first sidewall insulating film along the first direction; and (i) implanting ions of a third impurity of the first conductivity type into the main surface of the semiconductor substrate in order to form the second semiconductor region at each end of the first gate electrode and the first sidewall insulating film and to further form the fourth semiconductor region at each end of the second gate electrode and the second sidewall insulating film, wherein, in (e), at least one of first dosage and first ion implantation angle for executing the implanting ions of the first impurity is reset from the second initial setting conditions according to a deviation of the second processed dimension from the third design dimension, and then the implanting ions of the first impurity is executed, and in (i), at least one of second dosage and second ion implantation angle for executing the implanting ions of the third impurity is reset from the first initial setting conditions according to a deviation of the first processed dimension from the first design dimension and a deviation of the third processed dimension from the second design dimension, and then the implanting ions of the third impurity is executed.

12. The method for manufacturing the semiconductor device according to claim 11, wherein the at least one of second dosage and second ion implantation angle for executing the implanting ions in (i) is reset according to a deviation of a sum of the first processed dimension and the third processed dimension from a sum of the first design dimension and the second design dimension.

13. The method for manufacturing the semiconductor device according to claim 12, wherein, in a case where the sum of the first processed dimension and the third processed dimension is greater than the sum of the first design dimension and the second design dimension, the second ion implantation angle is reset to be greater than the first initial implantation angle set in the first initial setting conditions.

14. The method for manufacturing the semiconductor device according to claim 12, wherein, in a case where the sum of the first processed dimension and the third processed dimension is greater than the sum of the first design dimension and the second design dimension, the second dosage is reset to be greater than the first initial dosage set in the first initial setting conditions.

15. The method for manufacturing the semiconductor device according to claim 11, wherein, in a case where the second processed dimension is greater than the third design dimension, the first ion implantation angle is reset to be greater than the second initial implantation angle set in the second initial setting conditions.

16. The method for manufacturing the semiconductor device according to claim 11, wherein, in a case where the second processed dimension is greater than the third design dimension, the first dosage is reset to be greater the second initial dosage set in the second initial setting conditions.

17. The method for manufacturing the semiconductor device according to claim 11, wherein an impurity concentration in the first semiconductor region is lower than an impurity concentration in the third semiconductor region.

* * * * *